United States Patent [19]
Eitan

[11] Patent Number: 6,134,156
[45] Date of Patent: Oct. 17, 2000

[54] METHOD FOR INITIATING A RETRIEVAL PROCEDURE IN VIRTUAL GROUND ARRAYS

[75] Inventor: Boaz Eitan, Ra'anana, Israel

[73] Assignee: Saifun Semiconductors Ltd., Netanya, Israel

[21] Appl. No.: 09/246,776

[22] Filed: Feb. 4, 1999

[51] Int. Cl.[7] .................................................. G11C 16/04
[52] U.S. Cl. ........................................................ 365/189.07
[58] Field of Search ............................. 365/189.07, 204, 365/185.16, 185.05

[56] References Cited

U.S. PATENT DOCUMENTS 5,477,499  12/1995  Van Buskirk et al. ................. 365/218
5,521,870  5/1996  Ishikawa ............................ 365/189.07

*Primary Examiner*—David Nelms
*Assistant Examiner*—David Lam
*Attorney, Agent, or Firm*—Skjerven, Morrill, MacPherson, Franklin & Friel LLP; Alan H. MacPherson

[57] ABSTRACT

A method for detecting the content of a selected memory cell in a memory cell array includes the steps of charging a drain of the selected memory cell to a ground potential, charging a source of the selected memory cell to a predetermined voltage potential, detecting the voltage level on the drain and comparing the detected voltage level with a reference voltage level, thereby producing a comparison result.

12 Claims, 6 Drawing Sheets

METHOD FOR INITIATING A RETRIEVAL PROCEDURE IN VIRTUAL GROUND ARRAYS

FIELD OF THE INVENTION

The present invention relates to methods and semiconductor memory systems for storing and managing data in general and to methods for initiating a retrieval procedure from data storage units, in particular.

BACKGROUND OF THE INVENTION

Memory devices, such as random access memory (RAM), read only memory (ROM), non-volatile memory (NVM) and the like are known in the art.

Reference is now made to FIG. 1 which is a schematic illustration of a virtual ground memory array, generally referenced 10, which is known in the art. Array 10 includes a plurality of memory cells 16, a plurality of word lines 12 and a plurality of bit lines 14.

The memory cells 16 are arranged in a matrix. Each of the memory cells 16 is also denoted by an index (x,y) which indicates its location within the matrix.

Each row of cells is integrally connected to a word line. For example, all of the cells in the first upper line of cells, from cell $16_{(1,1)}$ to cell $16_{(M,1)}$, are connected to word line $12_1$. Each column of cells is connected to two bit lines, one on either side. For example, all of the cells in the left column, from cell $16_{(1,1)}$ to cell $16_{(1,N)}$, are connected to bit line $14_1$, on one side (left) and to bit line $14_2$ on the other side (right). In general, a cell $16_{(x,y)}$ is connected to word line $12_y$ and to bit lines $14_x$ and $14_{x+1}$.

Accordingly, tapping onto a selected word-line and two selected adjacent bit lines enables performing various procedures on the cell which is connected thereto.

At first, the source and drain bit-lines are connected to a voltage source which provides a predetermined voltage level of $V_1$ ($V_1>0$, and typically, around 1.5 volts), thereby pre-charging them to that predetermined voltage level $V_1$. The voltage level $V_1$ is selected according to a plurality of parameters, such as the memory cell characteristics, the word line voltage and the like. The voltage level $V_1$ is typically in the range of 1–2 volts.

Then, the source bit-line is discharged to ground potential, the drain bit-line is disconnected from the $V_1$ voltage source and is connected to a sensing amplifier, referenced 22, via a decoder 20. The voltage level which is detected on the drain bit-line is used to determine the data content of the read memory cell.

It is noted that the decoder 20 generally includes all of the electronic units which are located between the selected cell and the sensing amplifier 22.

The following is an example of a conventional method for reading the content of a selected cell. In a read procedure, one of the two selected bit lines is defined as a source and the other is defined as a drain from which the content of the cell will be read. For reading the content of memory cell $16_{(L+1,K)}$, bit line $14_{L+1}$ is defined as a source and bit line $14_{L+2}$ as the drain.

Reference is now made to FIGS. 2 and 3. FIG. 2 is an illustration of a voltage versus time diagram, relating to the voltage which is applied and detected over a drain bit line. FIG. 3 is a schematic illustration of a method for detecting the content of a selected memory cell which is known in the art. The following is a description of this method.

In step 50, a plurality of bit lines are connected to a voltage source (not shown) and are thus pre-charged to a predetermined voltage level $V_1$ (typically around 1.5 volts). These bit lines include the source bit line $14_{L+1}$, the drain-bit line $14_{L+2}$ and other bit-lines which are adjacent to the drain bit-line, such as bit-lines $14_{L+3}$ and $14_{L+4}$.

It will be appreciated by those skilled in the art that a cell experiences electrical activity when there is a voltage difference between the two bit-lines which are connected thereto. Accordingly, if bit-line $14_{L+3}$ is kept at a potential which is different than $V_1$, then cell $16_{(L+2,K)}$ will conduct current.

For example, when bit-line $14_{L+3}$ is kept at a voltage level which is lower than $V_1$, then it is considered a source bit-line of cell $16_{(L+2,K)}$, while bit-line $14_{L+2}$ is considered a drain bit-line for that cell $16_{(L+2,K)}$. In a situation such as this, cell $16_{(L+2,K)}$ conducts electrical current and hence, "leaks" electrical current towards bit-line $14_{L+2}$.

The electrical current which is detected from bit-line $14_{L+2}$ now includes currents received from cell $16_{(L+1,K)}$ as well as from cell $16_{(L+2,K)}$. Such a leakage from a neighbor cell $16_{(L+2,K)}$ induces an error in the reading of cell $16_{(L+1,K)}$. Furthermore, as the voltage gap between bit-lines $14_{L+2}$ and $14_{L+3}$ increases, so does the current leakage from cell $16_{(L+2,K)}$, and hence the induced error. It will be appreciated by those skilled in the art that such errors significantly interfere with any reading attempt of the selected cell $16_{(L+1,K)}$.

The general common approach, known in the art, is to attempt to eliminate the electrical activity within adjacent cells, such as cell $16_{(L+2,K)}$, by equating the voltage on bit lines which are connected thereto. Accordingly, bit line $14_{L+3}$ is connected to a voltage source of the same electrical potential level (i.e., $V_1$).

It is hereby noted that such leakage effects of neighbor cells also extend to other adjacent cells, located in the same row, further down the line from cell $16_{(L+2,K)}$. Hence, it is recommended that an electrical potential of $V_1$ will be applied to the bit lines which are connected thereto, such as bit-lines $14_{L+4}$.

In step 52, the source bit-line is discharged to ground, thereby establishing electrical activity within memory cell $16_{(L+1,K)}$.

With reference to FIG. 2, section 30 illustrates the voltage rise, during the pre-charge step 50, which can be read from bit-line $14_{L+2}$ as it is pre-charged to $V_1$.

In step 54, the drain bit-line $14_{L+2}$ and the neighbor bit-lines $14_{L+3}$ and $14_{L+4}$ are disconnected from the $V_1$ voltage source. The voltage level which is read from bit-line $14_{L+2}$ can be now used to determine the state of the selected cell $16_{(L+1,K)}$ as being programmed or erased (step 56).

In step 56, the sensing amplifier 22 detects the voltage level of the drain bit-line $14_{L+2}$.

It will be appreciated by those skilled in the art that a memory cell, such as FLASH, ROM, EPROM, EEPROM, and the like, exhibits greater resistance to the flow of electrons therethrough when it is in a programmed state, contrary to the situation when it is in an erased state. Accordingly, an erased cell exhibits a faster decay of the voltage, detected at the drain bit-line, than a programmed cell does.

With reference to FIG. 2, line 32 represents the voltage level decay which is detected for a programmed cell, while line 34 represents the voltage level decay which is detected for an erased cell.

In step 58, at a predetermined point in time $T_2$, the detected voltage level ($V_{PROGRAMMED}$ or $V_{ERASED}$) is compared against a reference level $V_{REFERENCE}$. With reference to FIG. 2, line 36 represents a reference voltage profile, which reaches a reference voltage level $V_{REFERENCE}$ at time $T_2$.

In step 60, the sensing amplifier determines the value of the data which is stored in the selected cell. When the detected voltage level is located above the reference level $V_{REFERENCE}$, then the sensing amplifier provides an output which indicates that the cell is programmed. In this case, the detected voltage level decay is slower than the reference voltage decay.

Alternatively, when the detected voltage level is located below the reference voltage level $V_{REFERENCE}$, then the sensing amplifier provides an output which indicates that the cell is erased. In this case, the detected voltage level decay is faster than the reference voltage decay.

Finally, after a predetermined period of time, $T_2$, a programmed cell will reach a voltage level of $V_{PROGRAMMED}$, an erased cell will reach a voltage level of $V_{ERASED}$, and the reference voltage will reach a voltage level of $V_{REFERENCE}$.

Typically, the voltage levels of $V_{PROGRAMMED}$, $V_{ERASED}$ and $V_{REFERENCE}$ are around 1.5 volts and the differences $V_{PROGRAMMED} - V_{REFERENCE}$ and $V_{REFERENCE} - V_{ERASED}$ at $T_2$ are within a range of 50–100 mV. Thus we obtain that:

$$\frac{V_{PROGRAMMED} - V_{REFERENCE}}{V_{REFERENCE}} \approx \frac{V_{REFERENCE} - V_{ERASED}}{V_{REFERENCE}} \approx 0.05$$

$$\frac{V_{PROGRAMMD} - V_{REFERENCE}}{V_{REFERENCE}} \approx \frac{V_{REFERENCE} - V_{ERASED}}{V_{REFERENCE}} \approx 0.05$$

Accordingly, the portion of the relevant data signal (programmed or erased) within the overall detected signal is significantly small. Hence, extracting the encapsulated data from the detected signal is not an easy task. It will be appreciated by those skilled in the art that such a signal is considerably vulnerable to disturb effects which are induced by neighbor cells, due to leakage, therebetween.

According to the general approach, all of the array is kept at $V_1$, where only the source bit-lines of read cells are "pulled" to ground. It is noted that pre-charging an entire cell array to $V_1$ is a considerable task which requires large power supply units.

Another approach, known in the art, is commonly implemented for flash cell arrays. According to this approach, the array is segmented into a plurality of blocks, for example blocks of 1024 bit lines×32 word lines, 1024 bit lines×64 word lines or 1024 bit lines×128 word lines. This segmentation is necessary due to the programming and erasing disturbs which are related to the physical characteristics of flash cells.

Each time that a cell, in a selected block of cells, is read, a significant number of bit lines in that block of cells have to be pre-charged to a predetermined voltage level. Accordingly, the electrical current which is needed for this multiple bit-line pre-charge is significantly high. Moreover, the initiation of such a pre-charge is characterized by a sudden rise in the electrical current load. It is noted that, in order to provide the required conditions, the pre-charge mechanism has to include a high current power supply.

A conventional flash cell in a $0.35\mu$ technology is characterized by a capacitance of 5 fF, per bit. A block of 1024×128 cells is therefore characterized by a capacitance of around 600 pF.

Conventional pre-charge mechanisms include either P-type transistors or N-type transistors. Such a pre-charge mechanism switches a bit-line between ground voltage level and an intermediate voltage level $V_1$. Conventionally, a large number of bit-lines have to be pre-charged and equalized to a predetermined intermediate voltage level. Using N-type transistors prolongs the equalization time period at the intermediate voltage level, due to their non-low impedance.

Reducing this time period requires reducing the impedance, conventionally by enlarging the transistor, which Increases the size of the chip.

It is noted that a pre-charge structure which includes a P-type transistor and an N-type transistor is also known in the art. The P-type transistor is used for charging to intermediate voltage levels and the N-type transistor is used for charging to ground level. It is noted that such a structure consumes large chip area.

According to yet another approach, only several bit lines, adjacent to the drain bit-line, are pre-charged to $V_1$, so as to reduce the amount of current required for each pre-charge procedure. To determine and select the neighbor bit lines, a special Y-decoder is used. A Y-decoder is a conventional device which is used to connect each of the cells outside of the array either to a pre-charge unit or to a sensing unit. When a Y-decoder receives a request to access a selected cell, it determines which of the adjacent cells, and respective bit-lines, have to participate in the pre-charge procedure. It is noted that such a mechanism is highly complicated, due to the plurality of cases which are present in such a system. Constructing such a Y-decoder consumes considerable amounts of space and resources, within the designed chip.

Furthermore, it is noted that the number of neighbor cells, which participate in the pre-charge procedure has a significant effect on the readout which is detected on the read cell drain bit-line. When the number of neighbor cells is small, there is a high probability of interference from the neighbor cells to the read cell. When the number of neighbor cells is large, then there is a large current spike.

The external power supply voltage ($V_{CC}$) which is provided to the chip can be in a broad range, typically from 2.7 to 3.6 volts. It is noted that, since the internal pre-charge voltage levels have to be accurate (around 1.5 to 1.6 volts), it is necessary to design an internal, low impedance, regulated power supply unit for significantly large currents which can provide accurate pre-charge voltage for a plurality of bit-lines. Such a power supply unit requires a large amount of space and large currents to operate.

It will be appreciated by those skilled in the art that the drive current parameter $I_{DRIVE}$ is used to characterize the current efficiency of a given transistor, where $$I_{DRIVE} (V_C - V_T - V_S)^2 (2.7 - |0.8 + 0.2| - 1.5)^2 = (0.2)^2 = 0.04.$$

With this low current efficiency, the pre-charge and equalization operations of the prior art require a significant amount of time to finish, a non-ideal situation.

SUMMARY OF THE PRESENT INVENTION

It is an object of the present invention to provide a novel method for initiating a retrieval procedure in memory arrays.

It is noted that the following definitions are used in the description of the invention: a "drain" is the bit line which is connected to the sensing amplifier and a "source" is the bit line which is connected to a constant voltage potential, which in the prior art, is the ground potential. In the present invention, the source is connected to a constant voltage potential, which is set to a voltage level greater than zero.

In accordance with the present invention, there is thus provided a method for detecting the content of a selected memory cell, within a memory cell array. Each of the memory cells includes a source and a drain. The method includes the steps of charging a drain of the selected memory cell to a ground potential, charging a source of the selected memory cell to a predetermined voltage potential, detecting the voltage level on the drain and comparing the detected voltage level with a reference voltage level, thereby producing a comparison result.

The method can further include the step of determining the content of the selected memory cell according to the comparison result.

The content is determined as programmed when the comparison result indicates that the detected voltage level is lower than the reference voltage level. Similarly, the content is determined as erased when the comparison result indicates that the detected voltage level is higher than the reference voltage level.

In accordance with another aspect of the invention there is provided an alternative method for detecting the content of a selected memory cell within a memory cell array. The method including the steps of connecting a source and drain of the selected memory cell to a ground potential voltage source, disconnecting the source from the ground potential voltage source, connecting the source to a voltage source having a predetermined voltage potential, disconnecting the drain from the ground potential voltage source, detecting the voltage level on the drain and comparing the detected voltage level with a reference voltage level, thereby producing a comparison result.

In accordance with a further aspect of the invention, there is provided a method for detecting the content of a selected memory cell within a memory array. In this array, there is a junction between every two neighboring memory cells and each junction is connected to a bit-line. The source of the selected memory cell is connected to a first one of the junctions and the drain end of the selected memory cell is connected to a second one of the junctions. The method includes the steps of connecting the junctions to a ground potential voltage source, thereby charging the memory cell array to a ground potential voltage potential, disconnecting the first one of the junctions from the ground potential voltage source, connecting the first one of the junctions to a voltage source, thereby charging the selected memory cell source to a predetermined voltage potential, disconnecting the second one of the junctions from the ground potential voltage source, detecting the voltage level on the second one of the junctions and comparing the detected voltage level with a reference voltage level, thereby producing a comparison result.

It is noted that this method is applicable for virtual ground arrays where each of the junctions is connected to a separate bit-line and the gates of the cells in a selected row are connected to the same word-line.

BRIEF DESCRIPTION OF THE DRAWINGS

The present invention will be understood and appreciated more fully from the following detailed description taken in conjunction with the drawings in which.

DETAILED DESCRIPTION OF PREFERRED EMBODIMENTS

The present invention attempts to overcome the disadvantages of the prior art by providing a method in which the drain bit lines are pre-charged to ground.

The following definitions are used in the description of the present invention: a "drain" is the bit line which is connected to the sensing amplifier and a source is determined the line which is connected to a constant voltage potential, which, in the prior art, is the ground potential. In the present invention, the source is connected to a constant voltage potential, which is set to a voltage level greater than zero.

Figure 4:
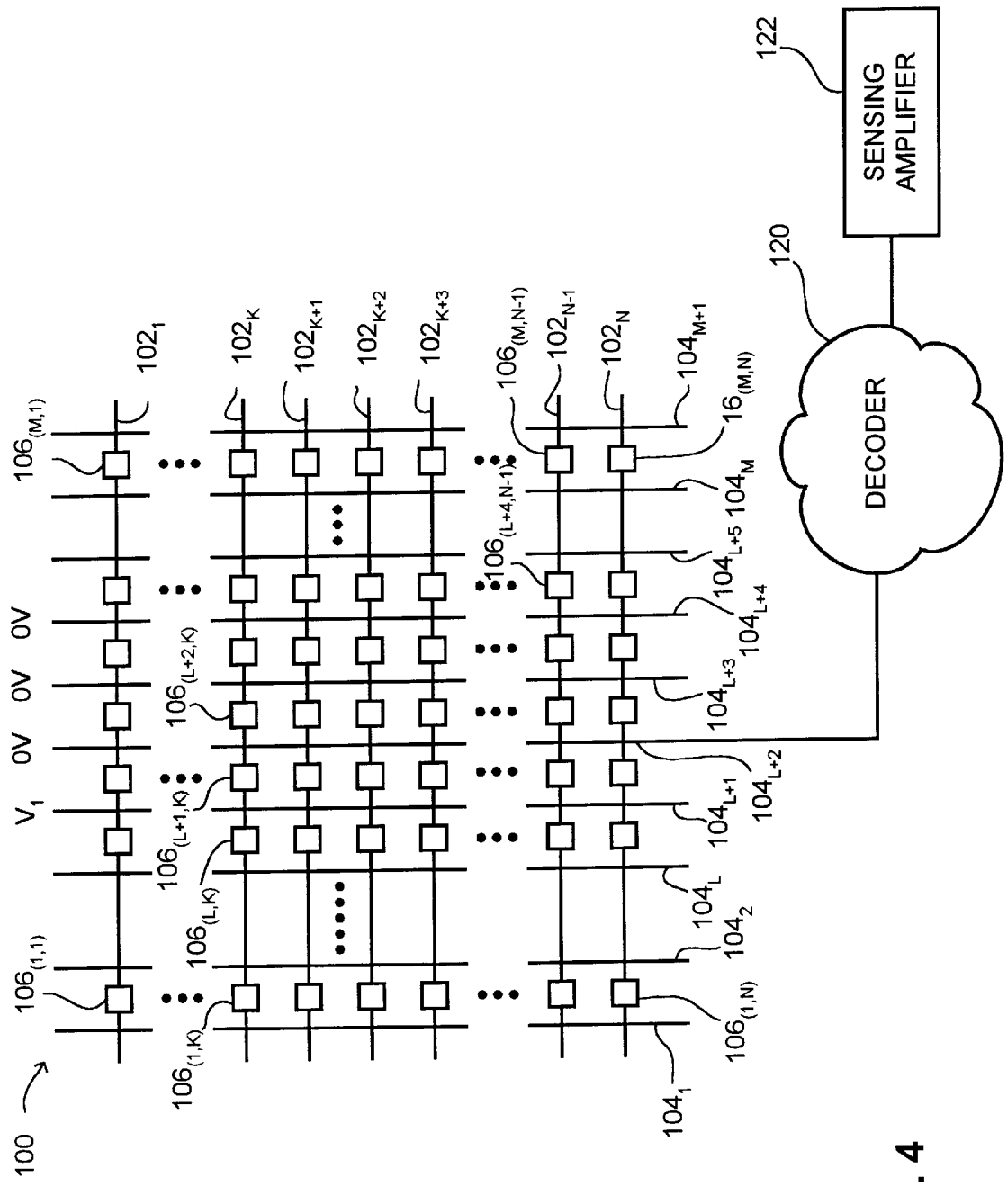
FIG. 4 is a schematic illustration of a memory array, operative in accordance with a preferred embodiment of the present invention.

Reference is now made to FIG. 4, which is a schematic illustration of a memory array, generally referenced 100, operative in accordance with a preferred embodiment of the present invention. Memory array 100 includes a plurality of memory cells 106, a plurality of word lines 102 and plurality of bit lines 104.

Figure 1:
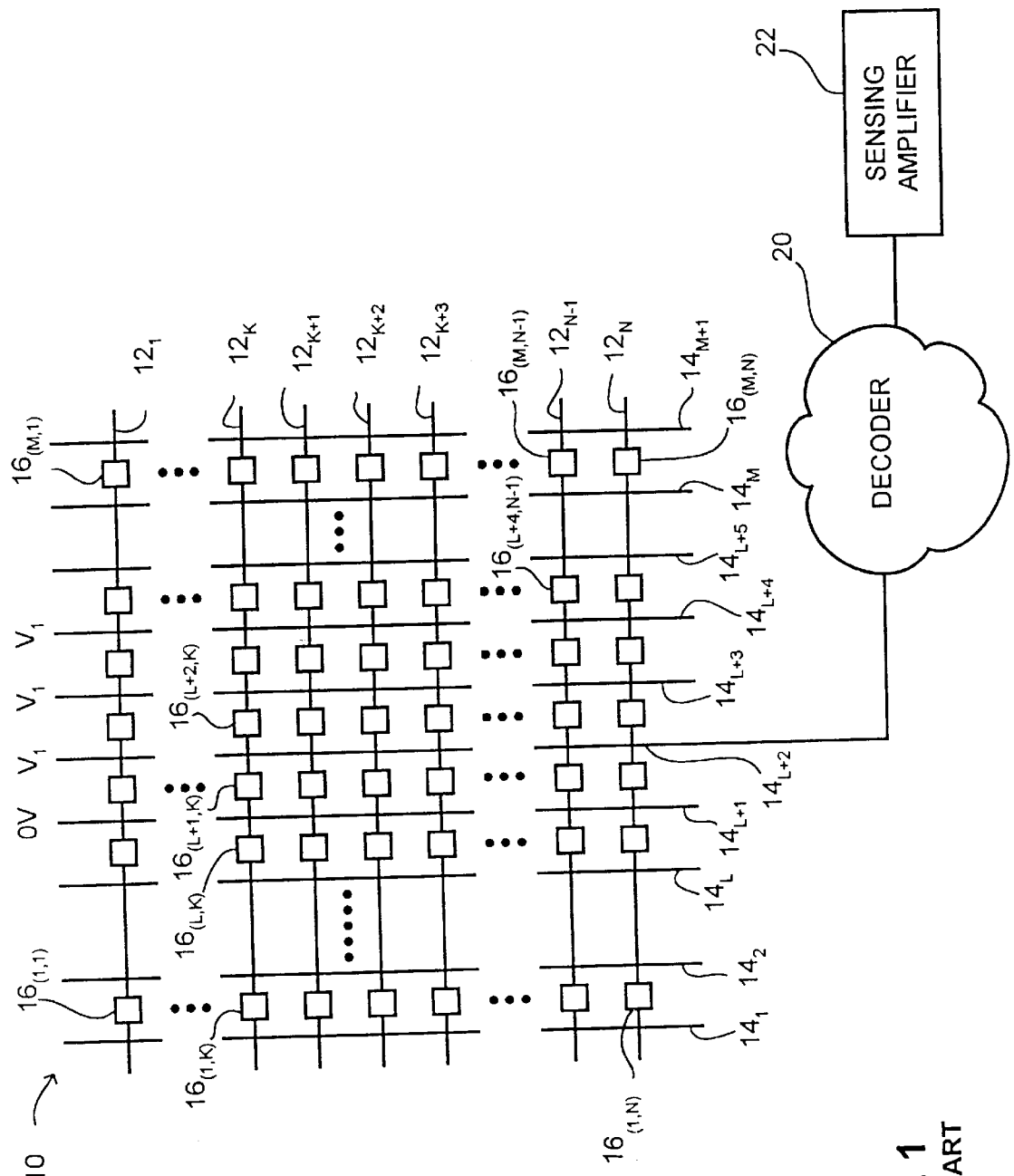
FIG. 1 is a schematic illustration of a prior art memory array.
Figure 2:
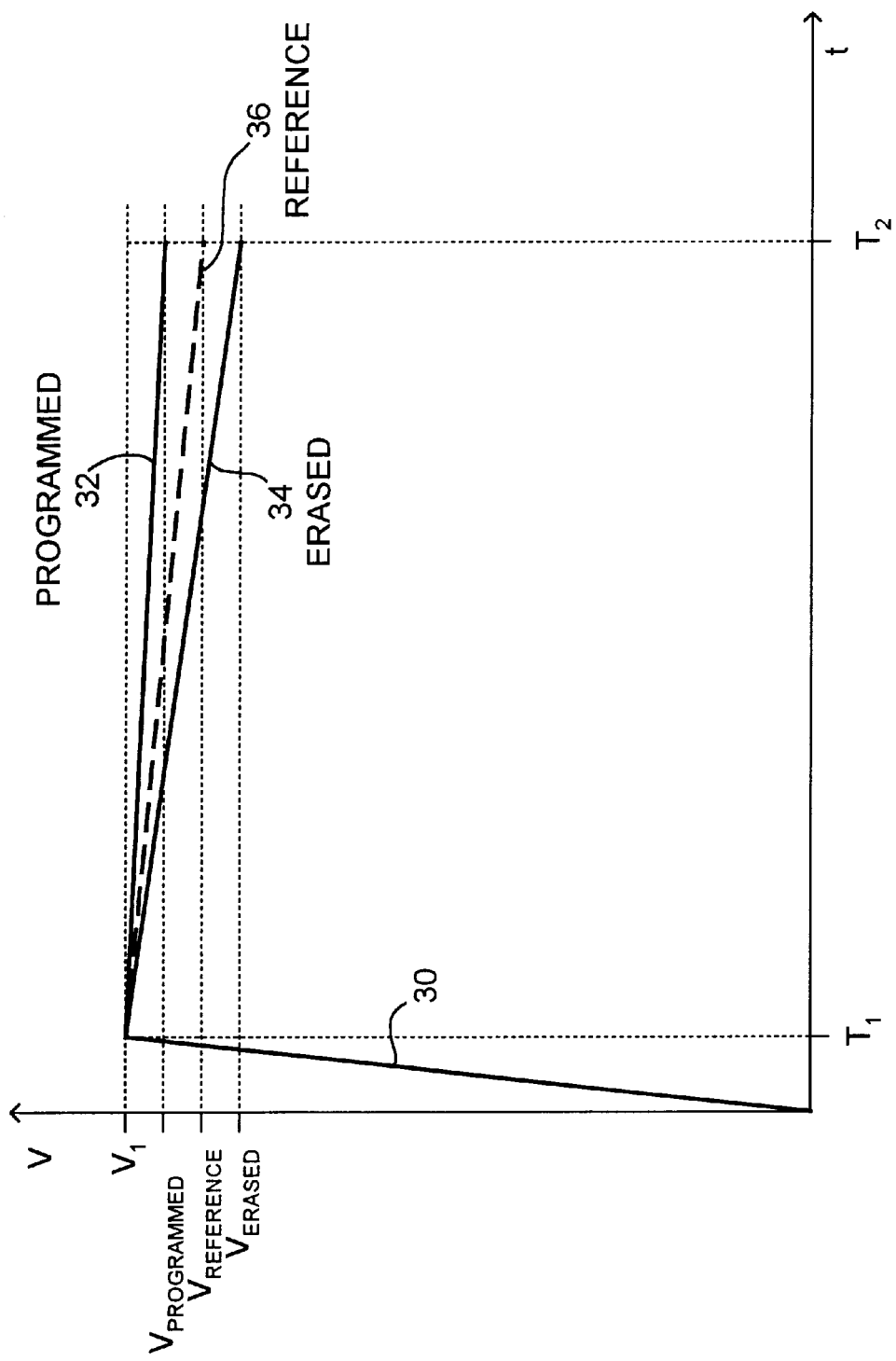
FIG. 2 is an illustration of a prior art voltage versus time diagram, relating to the voltage which is applied and detected over a drain bit line, which is known in the art.
Figure 3:
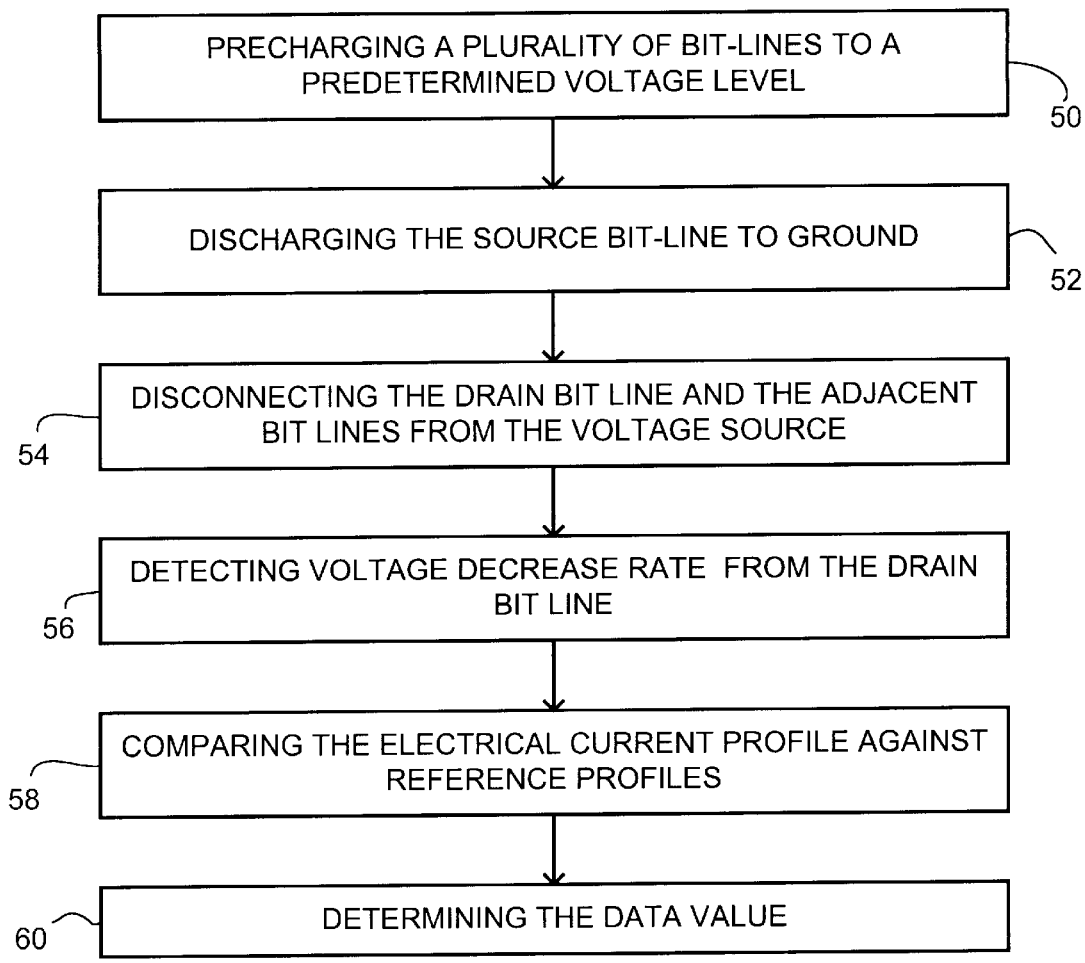
FIG. 3 is a schematic illustration of a prior art method for detecting the content a selected memory cell.

As in FIG. 1, the memory cells 106 are arranged in a matrix. Each row of cells is integrally connected to a word line 102. Each column of cells is connected to two bit lines, one on either side. In general, a cell $106_{(x,y)}$ is connected to word line $102_y$ and to bit lines $104_X$ and $104_{X+1}$.

According to the present invention and as noted in FIG. 4, at first, all of the bit-lines 104 are discharged to ground and then, the bit-line which is selected as a source bit-line is charged to a predetermined voltage level $V_1$.

Figure 5:
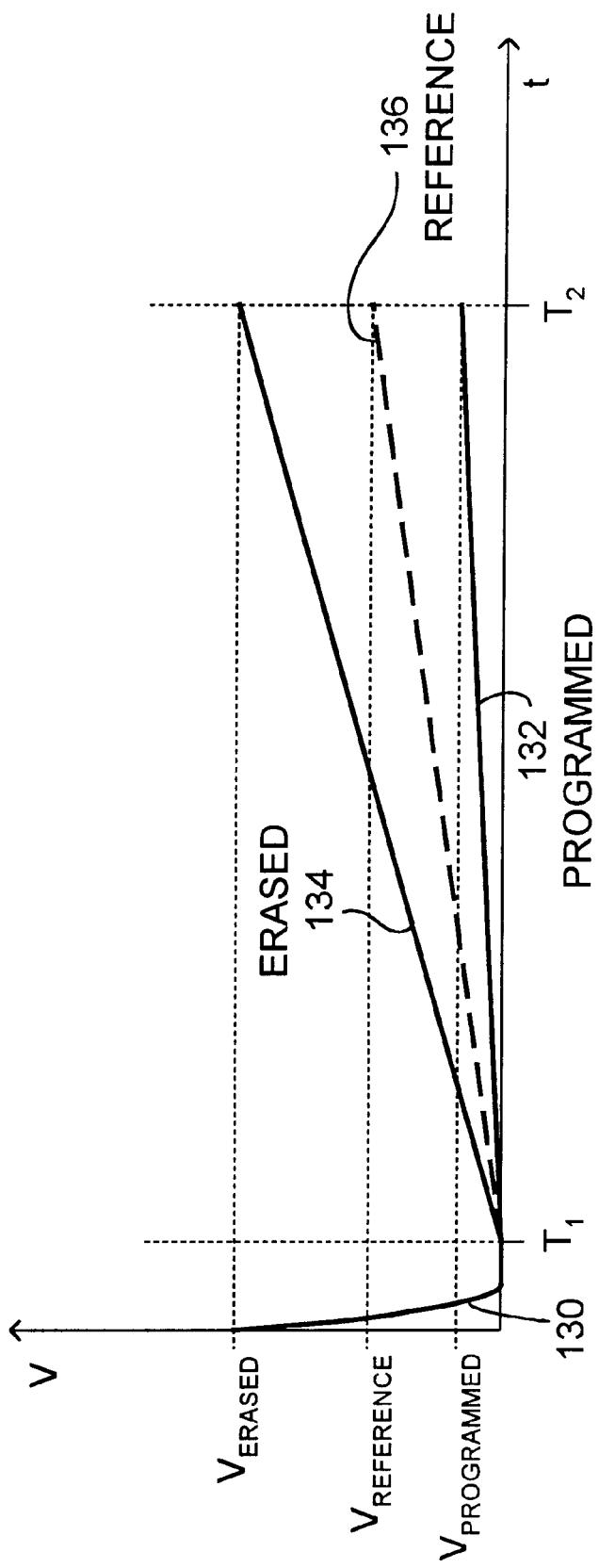
FIG. 5 is an illustration of a voltage versus time diagram for the memory array of FIG. 4, relating to the voltage which is applied and detected over a drain bit line.
Figure 6:
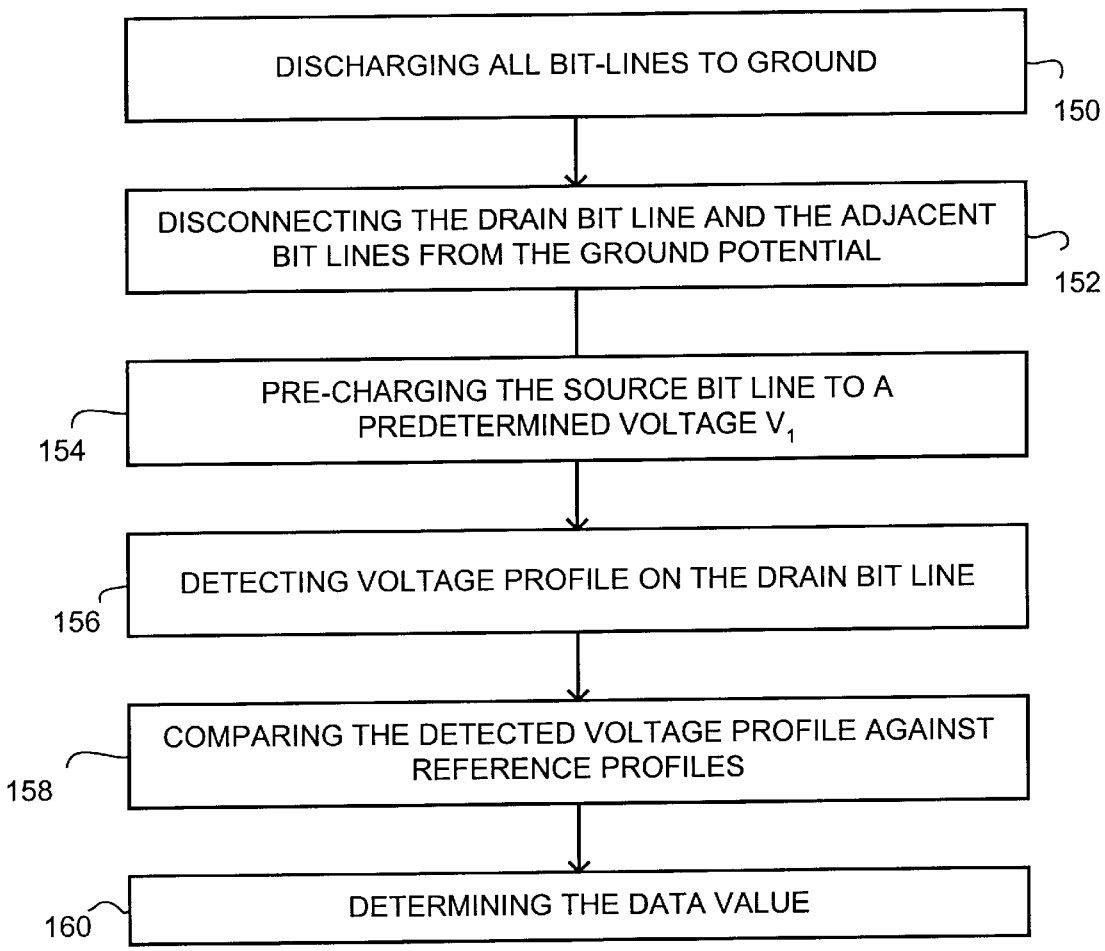
FIG. 6 is a schematic illustration of a method for detecting the content a selected memory cell, operative in accordance with a preferred embodiment of the present invention.

Reference is further made to FIGS. 5 and 6. FIG. 5 is an illustration of a voltage versus time diagram relating to the voltage which is applied and detected over a drain bit line, according to a preferred embodiment of the present invention. FIG. 6 is a schematic illustration of a method for detecting the content of a selected memory cell, operative in accordance with a preferred embodiment of the present invention.

The method of the present invention is hereby presented by an example of a retrieval procedure of the data which is stored in cell $106_{(L+1,K)}$. Cell $106_{(L+1,K)}$ is connected to word-line $102_K$ and to bit-lines $104_{L+1}$ and $104_{L+2}$. In the present example, bit-line $104_{L+1}$ is defined as the source bit-line and bit line $104_{L+2}$ is defined as the drain bit-line from which the data is read.

In step 150, all of the bit-lines 104 are discharged to ground. With reference to FIG. 5, line 103 denotes the discharge of the drain bit-line $104_{L+2}$ to ground potential. It is noted that the discharging to ground can be limited to the bit lines in the vicinity of the read memory cell which include the source bit-line, the drain bit-line and the bit-lines which are adjacent to the drain bit-line, such as bit-lines $104_{L+3}$, $104_{L+4}$ and $104_{L+5}$.

In step 152, the source bit-line is pre-charged to a predetermined voltage level. In the present example, bit-line $104_{L+1}$ is connected to a voltage source, having a predetermined voltage level $V_1$, and hence is pre-charged to that voltage level $V_1$.

Voltage level $V_1$ is determined according to a plurality of considerations, such as the type of memory cell used, the word-line voltage and the like. For example, when the memory cells are NROM memory cells, such as described in U.S. Pat. No. 5,768,192, then $V_1$ can be in the range of 1.3 volts to 2 volts.

In step 154, the drain bit line and the adjacent bit lines are disconnected from the ground potential. Accordingly, drain bit-line $104_{L+2}$ and adjacent bit-lines $104_{L+3}$, $104_{L+4}$ and $104_{L+5}$ are disconnected from the ground potential. At this point, the voltage level which is detected on the drain bit-line rises.

In step 156, the voltage level on the drain bit-line ($104_{L+2}$) is detected and used, later on, to determine the data which is stored within the read cell. The detection of the voltage level of the drain bit-line is performed by sensing amplifier 122, via decoder 120.

The read cell exhibits a degree of resistance which is associated with the amount of electrons stored therein. When the cell is programmed with electrons, it exhibits a level of resistance which is greater than the level of resistance at the state of erasure (i.e., essentially no electrons stored therein).

Accordingly, the detected voltage level of a programmed cell is characterized by a moderate voltage rise rate, while the detected voltage level of an erased cell is characterized by a faster voltage rise rate.

Referring to FIG. 5, line 132 represents the detected voltage profile of a programmed cell, while line 134 represents the detected voltage profile of an erased cell.

In step 158, the detected voltage level is compared against the reference level. In the present example, the detected voltage level, at time point $T_2$, is compared against a single reference level.

In step 160, the data value of the read cell is determined. When the detected voltage level is above the reference level, then the cell is defined as being erased. Otherwise, when the detected voltage level is below the reference level, then the cell is defined as being programmed.

It is noted that step 158 can be implemented in alternative ways, where more than one reference level is used.

Furthermore, it is noted that the present invention eliminates the need to pre-charge adjacent bit-lines to predetermined voltage levels, thereby significantly reducing the noise which can be induced therefrom.

The pre-charge voltage level of the drain bit line is ground and the source voltage level can be provided in a broad range, from 0.2 to 2 volts or higher. Accordingly, the present invention provides a pre-charge method which is tolerant of a variety of $V_{CC}$ voltage levels. This eliminates the need for a tightly regulated power supply.

It is noted that the method of the present invention does not require equalizing of a plurality of bit-lines to a predetermined voltage level above zero. This minimizes the power requirements and hence the size of the power supply unit.

Furthermore, the present invention does not require that the single source bit-line, connected to the read cell, be charged to a specific voltage level, thereby eliminating the demand for a precise power supply unit.

According to the present invention, all of the bit-lines other than the source bit-line are kept at the ground voltage level, before and after the sensing (level detection) stage. As a result, a pre-charge to ground of each of these bit-lines is substantially easy, since, at the beginning of the pre-charge stage, the bit-line exhibits a voltage level which is significantly close to the final pre-charge level. Hence, the amount of charge being transferred during a pre-charge to ground operation is significantly low compared with a pre-charge to a predetermined voltage level, as in the prior art.

Another advantage of the present invention is that, since all of the bit-lines other than the source bit-line are pre-charged to ground, the Y-decoder does not have to cope with a plurality of situations and its complexity is significantly reduced.

Furthermore, since only a single bit-line is pre-charged to a predetermined substantial voltage level, the power consumption and initial current spike are relatively low. Hence, the present invention provides a pre-charge method which requires a low current power supply mechanism.

According to the present invention, no accurate voltage regulation mechanisms are required for the adjacent bit-lines, which significantly reduces the complexity of the overall system, since the entire collection of bit-lines are pre-charged to ground.

As a result, valuable chip material is spared, since no high current regulated voltage power supply units are required.

With respect to the drive current parameter $I^*_{DRIVE}$, for the present invention, the calculation is as follows:

$$I^*_{DRIVE} \; (V_C - V_T - V_S)^2 \; (2.7 - 0.8 - 0)^2 = (1.9)^2 = 3.61.$$

In comparison, the drive current of the prior art is proportional to 0.04. Hence $$\frac{I^*_{DRIVE}}{I_{DRIVE}} = \frac{3.61}{0.04} \approx 100$$

which indicates that, for the present invention, the time period for pre-charging is significantly shorter than that of the prior art. Moreover, the time period for equalization of the voltage potential over the bit lines of a memory array is also significantly shorter in the present invention than in the prior art.

It will be appreciated by persons skilled in the art that the present invention is not limited to what has been particularly shown and described hereinabove. Rather the scope of the present invention is defined only by the claims which follow.

What is claimed is:

1. In a memory cell array including a plurality of memory cells, a method for detecting the content of a selected memory cell, the method comprising the steps of:

charging a drain of said selected memory cell to a ground potential;

charging a source of said selected memory cell to a predetermined voltage potential;

detecting the voltage level on said drain; and comparing said detected voltage level with a reference voltage level, thereby producing a comparison result.

2. The method according to claim 1, further comprising the step of determining the content of said selected memory cell according to said comparison result.

3. The method according to claim 2, wherein said content is determined as programmed when said comparison result indicates that said detected voltage level is lower than said reference voltage level and wherein said content is determined as erased when said comparison result indicates that said detected voltage level is higher than said reference voltage level.

4. In a memory cell array including a plurality of memory cells, a method for detecting the content of a selected memory cell, the method comprising the steps of:

connecting a source and drain of said selected memory cell to a ground potential voltage source;

disconnecting said source from said ground potential voltage source;

connecting said source to a voltage source having a predetermined voltage potential;

disconnecting said drain from said ground potential voltage source;

detecting the voltage level on said drain; and comparing said detected voltage level with a reference voltage level, thereby producing a comparison result.

5. The method according to claim 4, further comprising the step of determining the content of said selected memory cell according to said comparison result.

6. The method according to claim 5, wherein said content is determined as programmed when said comparison result indicates that said detected voltage level is lower than said reference voltage level and wherein said content is determined as erased when said comparison result indicates that said detected voltage level is higher than said reference voltage level.

7. In a memory cell array including a plurality of memory cells having a junction between every two neighboring memory cells and each junction being connected to a bit-line, a method for detecting the content of a selected memory cell, the source of said selected memory cell being connected to a first one of said junctions, the drain end of said selected memory cell being connected to a second one of said junctions, the method comprising the steps of:

connecting said junctions to a ground potential voltage source, thereby charging said memory cell array to a ground potential voltage potential;

disconnecting said first one of said junctions from said ground potential voltage source;

connecting said first one of said junctions to a voltage source, thereby charging said selected memory cell source to a predetermined voltage potential;

disconnecting said second one of said junctions from said ground potential voltage source;

detecting the voltage level on said second one of said junctions; and comparing said detected voltage level with a reference voltage level, thereby producing a comparison result.

8. The method according to claim 7, further comprising the step of determining the content of said selected memory cell according to said comparison result.

9. The method according to claim 8, wherein said content is determined as programmed when said comparison result indicates that said detected voltage level is lower than said reference voltage level and wherein said content is determined as erased when said comparison result indicates that said detected voltage level is higher than said reference voltage level.

10. In a memory cell array including at least one row, a word line for each row and a plurality of bit-lines, the at least one row including a plurality of memory cells, each of the memory cells including at least a source end and a drain end, said source and drain ends being connected to different ones of the bit-lines, a method for detecting the content of a selected memory cell, the source of said selected memory cell being connected to a first one of the bit-lines, the drain end of said selected memory cell being connected to a second one of the bit-lines, the method comprising the steps of:

connecting said bit-lines to a ground potential voltage source, thereby charging said memory cell array to a ground potential voltage potential;

disconnecting said first one of said bit-lines from said ground potential voltage source;

connecting said first one of said bit-lines to a voltage source, thereby charging said selected memory cell source to a predetermined voltage potential;

disconnecting said second one of said bit-lines from said ground potential voltage source;

detecting the voltage level on said second one of said bit-lines; and comparing said detected voltage level with a reference voltage level, thereby producing a comparison result.

11. The method according to claim 10, further comprising the step of determining the content of said selected memory cell according to said comparison result.

12. The method according to claim 11, wherein said content is determined as programmed when said comparison result indicates that said detected voltage level is lower than said reference voltage level and wherein said content is determined as erased when said comparison result indicates that said detected voltage level is higher than said reference voltage level.

* * * * *